United States Patent
Pan et al.

(10) Patent No.: US 8,872,248 B2
(45) Date of Patent: Oct. 28, 2014

(54) CAPACITORS COMPRISING SLOT CONTACT PLUGS

(71) Applicant: Taiwan Semiconductor Manufacturing Company, Ltd., Hsin-Chu (TW)

(72) Inventors: Yu-Hong Pan, Tainan (TW); Jen-Pan Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/774,344

(22) Filed: Feb. 22, 2013

(65) Prior Publication Data

US 2014/0239363 A1    Aug. 28, 2014

(51) Int. Cl.
*H01L 27/108*  (2006.01)
*H01L 29/76*   (2006.01)
*H01L 29/94*   (2006.01)
*H01L 31/119*  (2006.01)
*H01L 27/04*   (2006.01)
*H01L 21/82*   (2006.01)

(52) U.S. Cl.
CPC .............. *H01L 27/04* (2013.01); *H01L 21/82* (2013.01)
USPC .................... 257/306; 257/532; 257/E27.114

(58) Field of Classification Search
USPC .................................... 257/306, 532, E27.114
See application file for complete search history.

(56) References Cited

U.S. PATENT DOCUMENTS 8,299,574 B2 * 10/2012  Plum .............................. 257/532

* cited by examiner

*Primary Examiner* — Phuc Dang
(74) *Attorney, Agent, or Firm* — Slater & Matsil, L.L.P.

(57) ABSTRACT

An integrated circuit includes a semiconductor substrate, and an insulation region extending from a top surface of the semiconductor substrate into the semiconductor substrate. An Inter-Layer Dielectric (ILD) is overlying the insulation region. A capacitor includes a first capacitor plate including a first slot contact plug, and a second capacitor plate including a second slot contact plug. The first and the second contact plugs include portions in the ILD. A portion of the ILD between vertical surfaces of the first slot contact plug and the second slot contact plug acts as a capacitor insulator of the capacitor.

20 Claims, 8 Drawing Sheets

US 8,872,248 B2

CAPACITORS COMPRISING SLOT CONTACT PLUGS

BACKGROUND

Capacitors are widely used in integrated circuits. Among the most commonly used capacitors are Metal-Insulator-Metal (MIM) capacitors. A typical MIM capacitor includes a bottom plate, a top plate over the bottom plate, and an insulation layer between the top plate and the bottom plate. The bottom plate and the top plate are formed of conductive materials.

As is known in the art, the capacitance of a capacitor is proportional to its area and the dielectric constant (k) of the insulation layer, and is inversely proportional to the thickness of the insulation layer. Therefore, to increase the capacitance, it is preferable to increase the area and k value, and to reduce the thickness of the insulation layer. The thickness and the k value, however, are often limited by the technology used for forming the capacitor. For example, the thickness of the insulation layer is limited by the breakdown voltage. On the other hand, since the MIM capacitors are often formed in low-k dielectric layers, the ability to increase the k value is also limited. To solve these problems, Metal-Oxide-Metal (MOM) capacitors were also developed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A capacitor and the method of forming the same are provided in accordance with various exemplary embodiments. The intermediate stages of forming the capacitor are illustrated. The variations of the embodiments are discussed. Throughout the various views and illustrative embodiments, like reference numbers are used to designate like elements.

Figure 1:
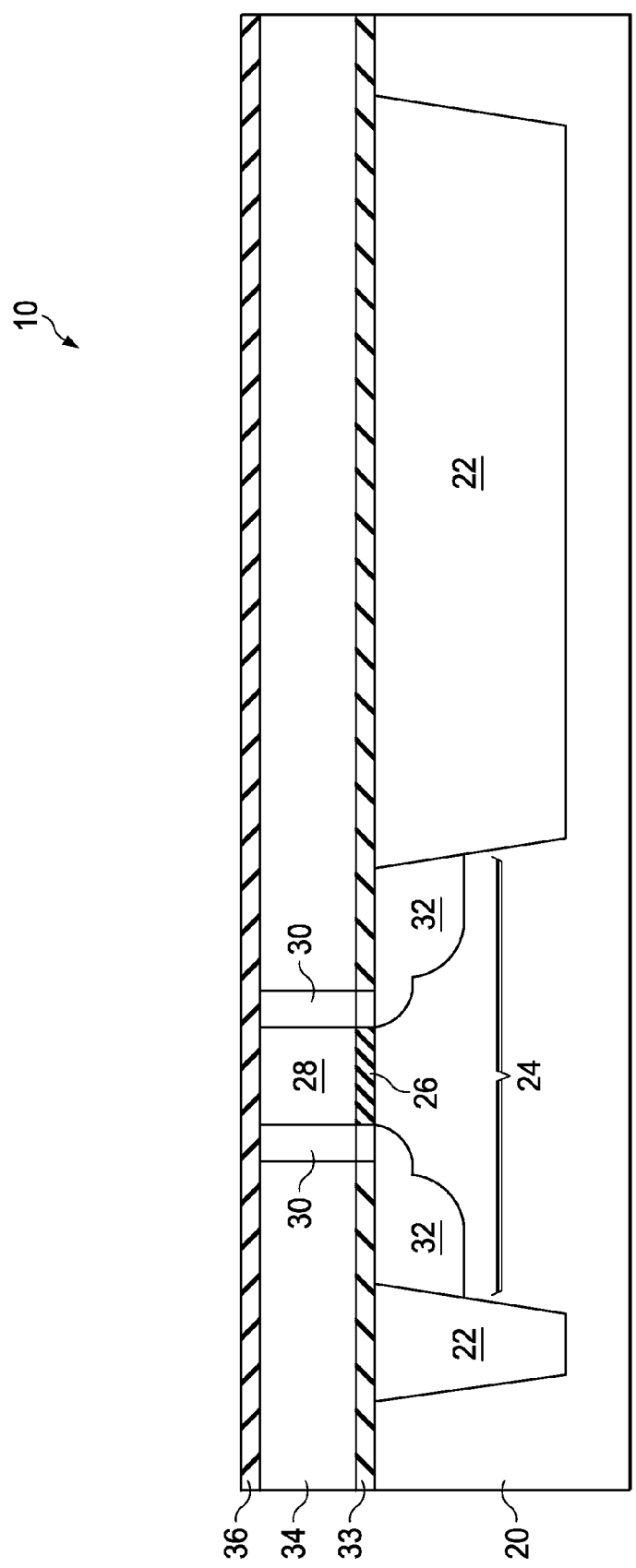
FIGS. 1 through 6B are cross-sectional views and top views of intermediate stages in the manufacturing of capacitors in accordance with some exemplary embodiments.

Referring to FIG. 1, wafer 10 is provided. Wafer 10 includes substrate 20, which may comprise silicon, silicon germanium, silicon carbon, gallium arsenide, a III-V compound semiconductor material, or the like. Substrate 20 may be a bulk substrate or a Semiconductor-On-Insulator (SOI) substrate. Insulation regions 22, which may be Shallow Trench Isolation (STI) regions, are formed in substrate 20, and extend from the top surface of substrate 20 into substrate 20. STI regions 22 may comprise silicon oxide.

Metal-Oxide-Semiconductor (MOS) device (transistor) 24 is formed at a top surface of substrate 20. MOS device 24 includes gate dielectric 26, gate electrode 28, and gate spacers 30 on the sidewalls of gate dielectric 26 and gate electrode 28. Source and drain regions 32 (referred to as source/drain regions hereinafter) may be portions of substrate 20 that are doped with a p-type or an n-typed impurity, depending on the conductivity type of the respective MOS device 24. Source/drain regions 32 may also comprise stressors (not shown) for applying stresses to the channel region of MOS device 24, wherein the stressors may be silicon germanium stressors or silicon carbon stressors. Although not shown, source/drain silicide regions may be formed as the top portions of source/drain regions 32, and/or the top portion of gate electrode 28. Gate electrode 28 may be a metal gate that is formed of metal or metal alloy(s), although gate electrode 28 may also be formed of polysilicon, metal silicides, or the like.

Gate electrode 28 is formed in Inter-Layer Dielectric (ILD, referred to as ILD0 hereinafter) 34, wherein ILD0 34 may be formed of an oxide such as Tetraethyl Orthosilicate (TEOS) oxide, silicon nitride, hafnium oxide, aluminum oxide, Phospho-Silicate Glass (PSG), Boro-Silicate Glass (BSG), Boron-Doped Phospho-Silicate Glass (BPSG), or the like. In some embodiments, gate electrode 28 is formed using a gate-last approach, and hence gate dielectric 26 extend to the sidewalls of gate electrode 28, although the gate-first approach may be adopted. The top surface of gate electrode 28 may be level with the top surface of ILD0 34.

In some embodiments, etch stop layer 33 is formed underlying ILD0 34. Etch stop layer 33 may be overlying, and in contact with, STI regions 22 and source/drain regions 32. Etch stop layer 33 comprises a material different from the materials of ILD0 34 and STI regions 22. For example, etch stop layer 33 may comprise silicon nitride, silicon carbide, or the like.

Figure 5A:
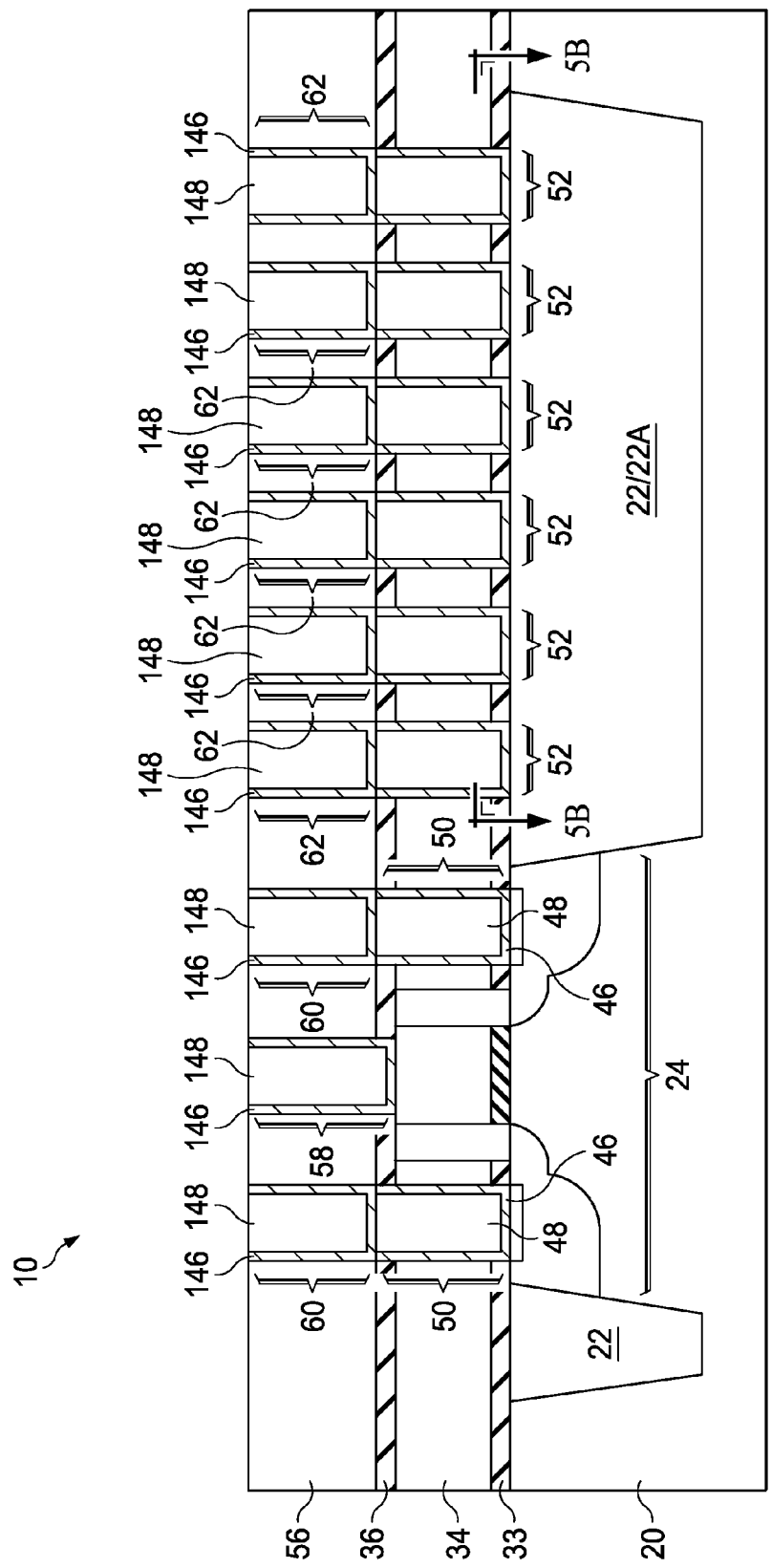

Chemical Mechanical Polish (CMP) stop layer 36, which also acts as an etch stop layer in subsequent process steps, is formed over ILD0 34 and gate electrode 28. CMP stop layer 36 may comprise a material different from the material of ILD0 34 and the overlying ILD1 56 (FIG. 5A). In some embodiments, CMP stop layer 36 comprises silicon nitride. In alternative embodiments, other dielectric materials such as silicon carbide, silicon oxynitride, or the like, may be used. The thickness of CMP stop layer 36 may be between about 30 Å and about 250 Å. It is realized, however, that the dimensions recited throughout the description are merely examples, and may be changed to different values.

Figure 2:
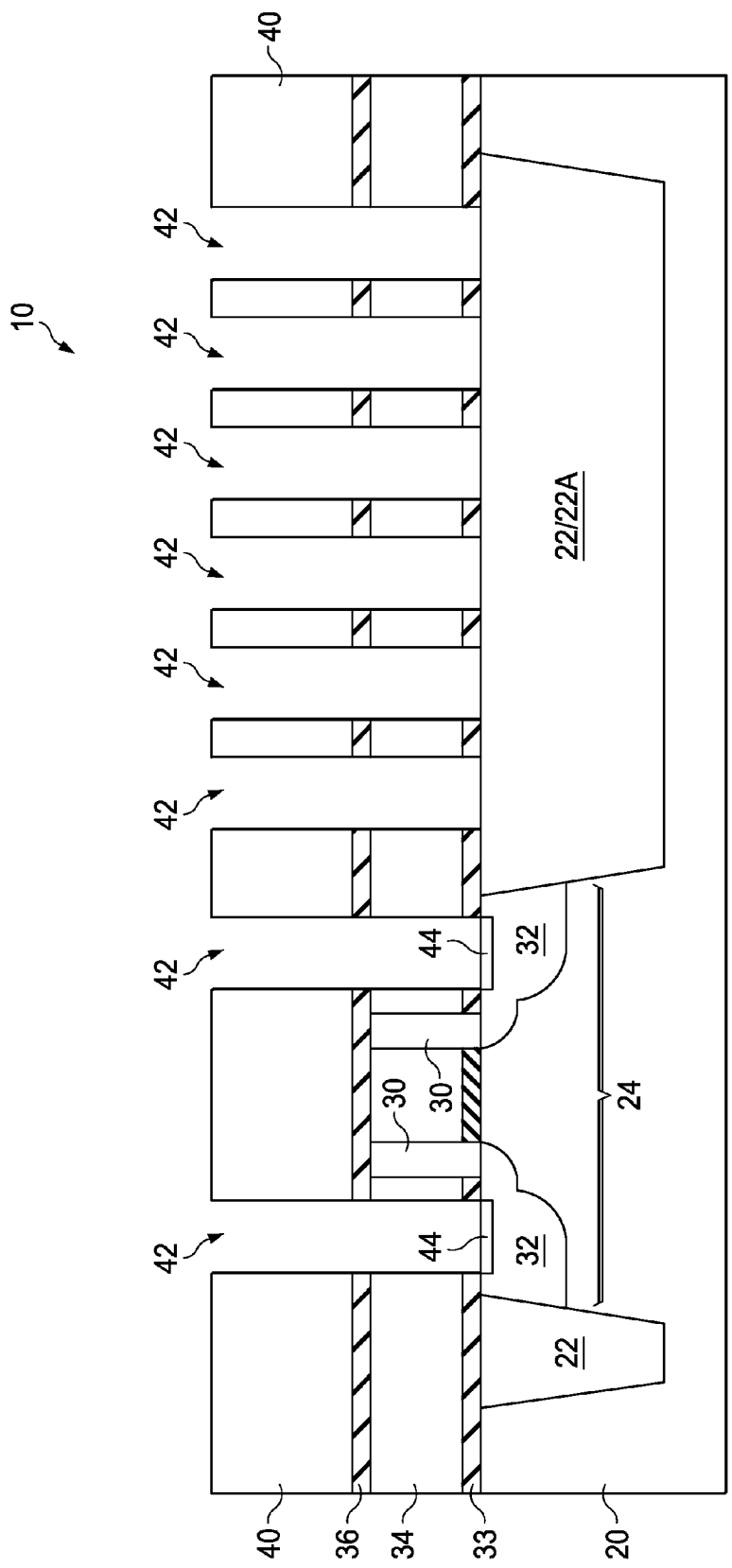

Next, referring to FIG. 2, photo resist 40 is formed over CMP stop layer 36, and is then patterned. CMP stop layer 36, ILD0 34, and etch stop layer 33 are then etched to form slot openings 42. Etch stop layer 33 is used to stop the etching, so that the etching may be stopped on source/drain regions 32. One of STI regions 22, which is denoted as 22A, is also exposed to slot openings 42 as a result of the etching. Slot openings 42 may have elongated top-view shapes, which shapes are the same as slot contact plugs 52 (including 52A, 52B, 52C, and 52D) in FIG. 5B. After the formation of slot openings 42, photo resist 40 is removed. In the embodiments wherein source/drain silicide regions have not been formed in previous steps, source/drain silicide regions 44 are formed at this time. The formation of silicide regions 44 include forming a metal layer (not shown), which extends into slot openings 42 and contacts source/drain regions 32, and performing an annealing to react the metal layer with source/drain regions 32. The unreacted portions of metal layer may then be removed, leaving silicide regions 44 in slot openings 42.

Figure 3:
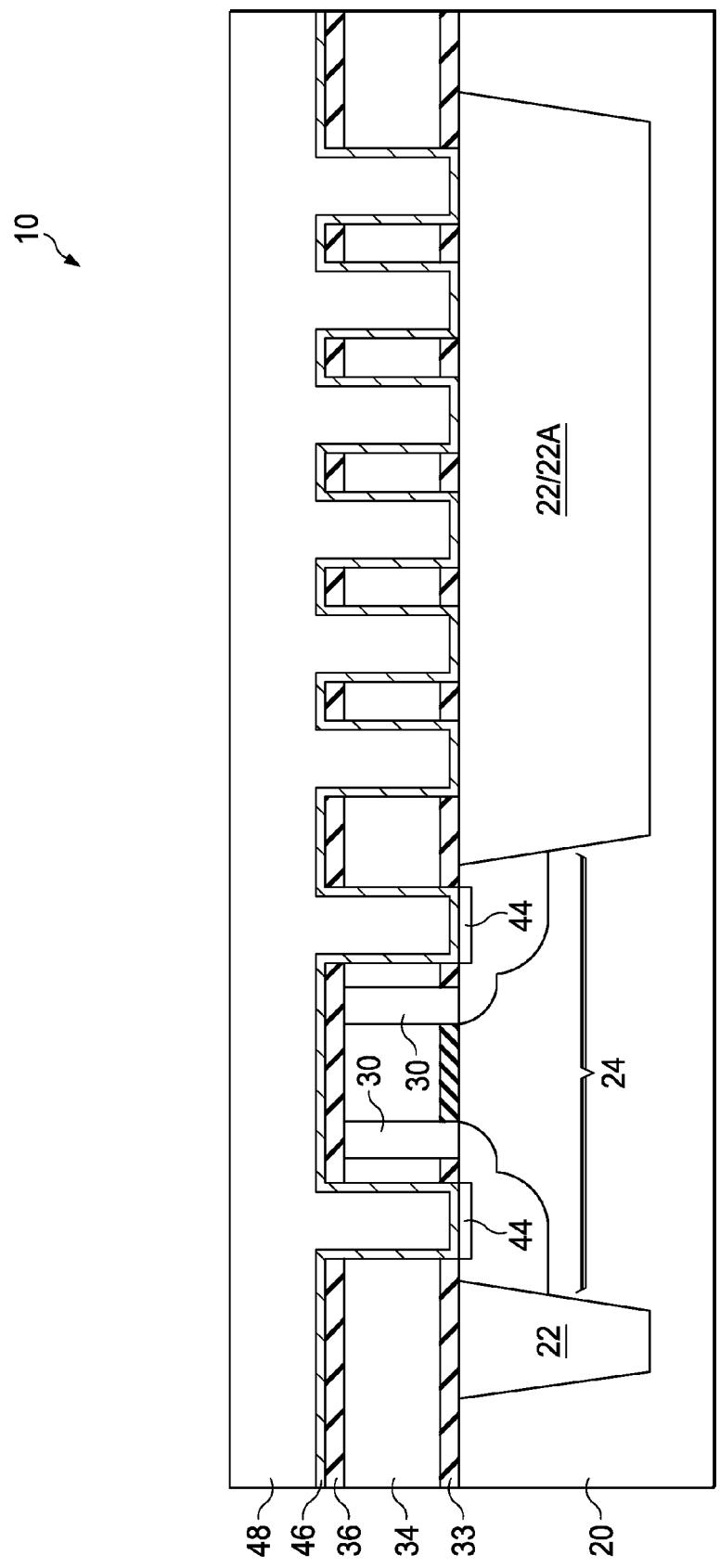

Next, as shown in FIG. 3, adhesion/barrier layer (also sometimes referred to as a glue layer) 46 is formed at the bottom and on the sidewalls of slot openings 42 (FIG. 2). Adhesion/barrier layer 46 further extends over the top surface of CMP stop layer 36. Metallic material 48 is then filled into the remaining portions of openings 42. In some embodiments, adhesion/barrier layer 46 is formed of a material selected from titanium, titanium nitride, tantalum, tantalum nitride, combinations thereof, or multi-layers thereof. Metallic material 48 may be formed of tungsten, aluminum, copper, or alloys thereof, for example. Metallic material 48 may be filled until an entirety of its top surface is higher than the top surface of CMP stop layer 36.

Figure 4:
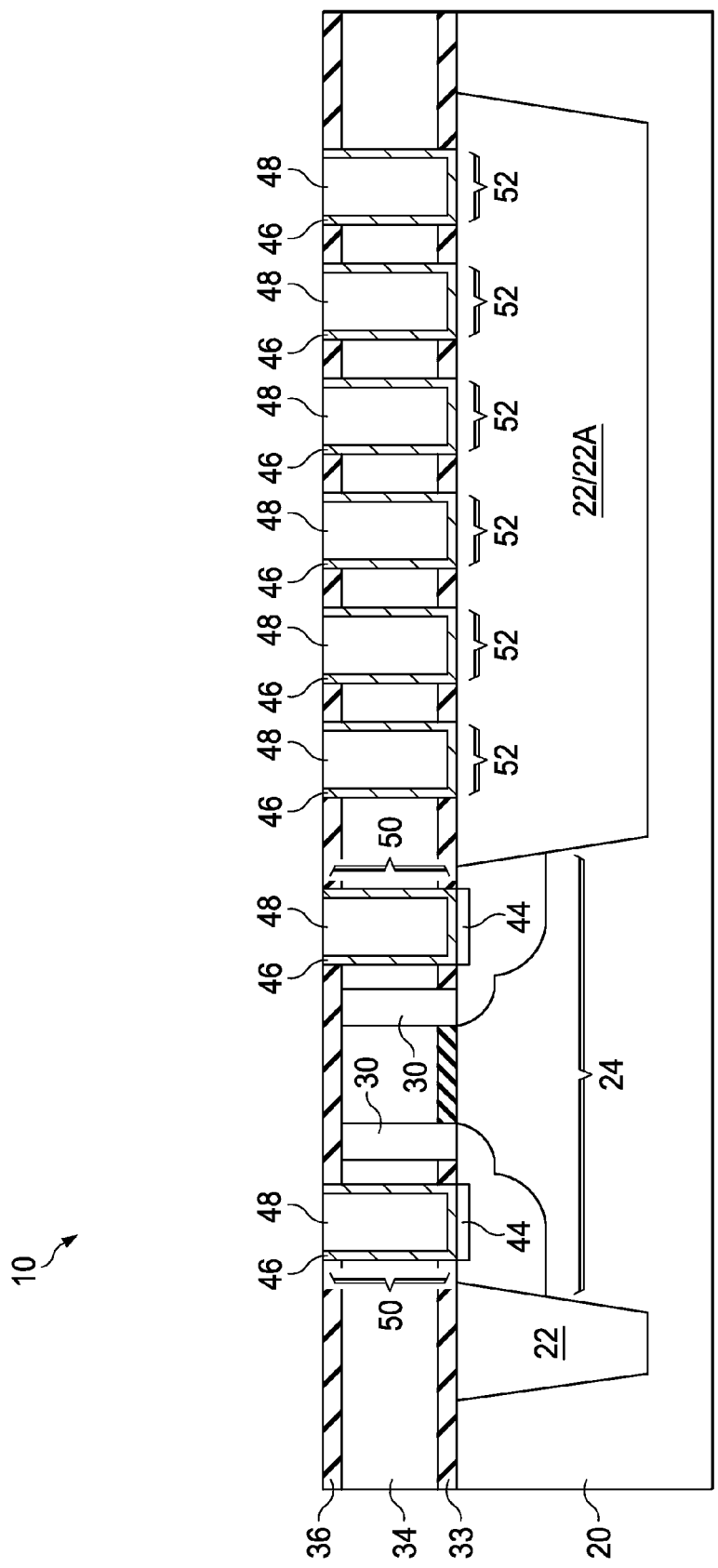

Referring to FIG. 4, a planarization process, which may be a Chemical Mechanical Polish (CMP) process, is performed to polish metallic material 48 and adhesion/barrier layer 46. The CMP process stops on CMP stop layer 36. In the resulting structure, the remaining portions of adhesion/barrier layer 46 and metallic material 48 form source/drain contact plugs (sometimes referred to as M0_OD1s) 50 and slot contact plugs 52. M0_OD1s 50 overlap, and are electrically coupled to, source/drain regions 32 and source/drain silicide regions 44. Slot contact plugs 52 overlaps, and may be in physical contact with, STI region 22A. Slot contact plugs 52 may include portions 52A, 52B, 52C, and 52D, as shown in FIG. 5B.

FIG. 5A illustrates the structure after the formation of ILD1 56, gate contact plug 58, source/drain contact plugs 60, and slot contact plugs 62. Gate contact plug 58 is alternatively referred to as an M0_poly since it is directly over and connected to gate electrode 28, which may be formed of poly-silicon in some embodiments. Source/drain contact plugs 60 are sometimes referred to as M0_OD2 since they are directly over and connected to M0_OD1 50. Slot contact plugs 62 may include portions 62A, 62B, 62C, and 62D, as shown in FIG. 5B. Contact plugs 58, 60, and 62 are formed in ILD1 56, wherein contact plug 58 is electrically coupled to, and may be in physical contact with, gate electrode 28, and contact plugs 60 are electrically coupled to, and may be in physical contact with, M0_OD1 50. Contact plugs 58, 60, and 62 may be formed using essentially the same process as forming contact plugs 50 and 52. For example, the formation process may include forming ILD1 56, etching ILD1 56 to form openings, filling the openings with an adhesion/barrier layer and a metallic material such as tungsten or copper, and performing a CMP. The remaining portions of the adhesion/barrier layer and the metallic material form contact plugs 58, 60, and 62. In addition, each of contact plugs 58, 60, and 62 may include adhesion/barrier layer 146 and filling metal 148. The materials of adhesion/barrier layer 146 and the filling metal 148 may be selected from the same groups of candidate materials for forming adhesion/barrier layer 46 and metallic material 48, respectively.

M0_OD2s 60 are aligned to the respective underlying M0_OD1s 50. Hence, each of M0_OD2s 60 forms one integrated source/drain contact plug with the underlying M0_OD1 50. Slot contact plugs 62 are aligned to the respective underlying slot contact plugs 52. Hence, each of slot contact plugs 62 forms one integrated slot contact plug with the underlying slot contact plug 52, which integrated slot contact plug is referred to as slot contact plug 52/62 hereinafter.

Figure 5B:
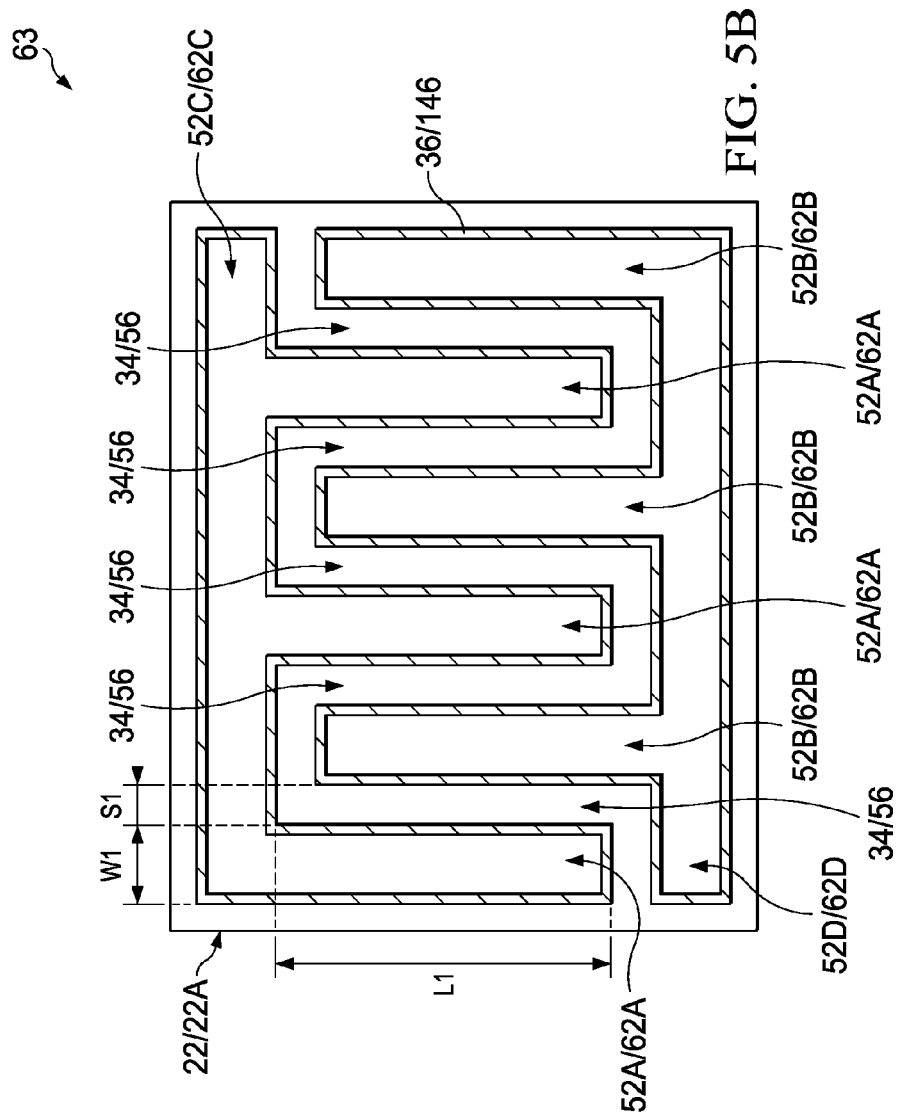

FIG. 5B illustrates a top view of slot contact plugs 52/62, wherein the top view is obtained from the plane crossing line 5B-5B in FIG. 5A. In some embodiments, in the top view, slot contact plugs 52 and 62 have elongated top-view shapes having length L1 and width W1 smaller than length L1. Ratio L1/W1 may also be greater than 5, or greater than about 10, although ratio L1/W1 may have any value greater than 1. As shown in FIG. 5B, slot contact plugs 52/62 includes slot contact plugs 52A/62A that are electrically interconnected through slot contact plug 52C/62C, and slot contact plugs 52B/62B that are electrically interconnected through slot contact plug 52D/62D. Slot contact plugs 52A/62A and 52B/62B are parallel to each other, with small spacing Si therebe-tween. In some embodiments, spacing Si is smaller than about 100 nm, or smaller than about 50 nm. Furthermore, spacing Si may be the minimum spacing that is allowed by the manufacturing technology for manufacturing the illustrated circuits. Slot contact plugs 52C/62C and 52D/62D are also formed at the same time slot contact plugs 52A/62A and 52B/62B are formed. Slot contact plugs 52A/62A, 52B/62B, 52C/62C, and 52D/62D in combination form capacitor 63, wherein the interconnected slot contact plugs 52A/62A and 52C/62C form a first capacitor plate (electrode) of capacitor 63, and the interconnected slot contact plugs 52B/62B and 52D/62D form a second capacitor plate (electrode) of capacitor 63. The portions of ILD0 34 and ILD1 56 between the first and the second capacitor plates are capacitor insulators of capacitor 63.

Figure 6A:
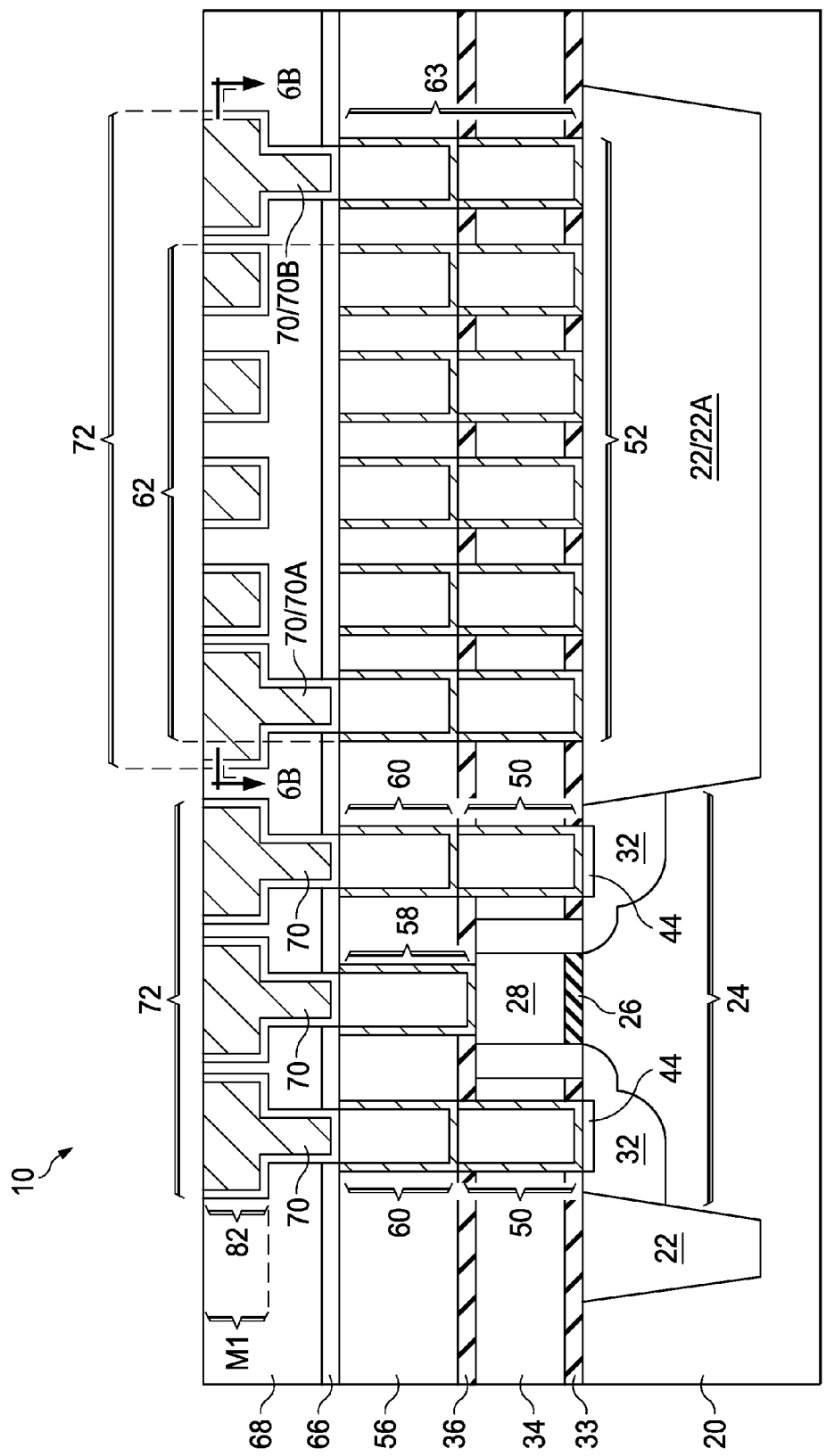

In subsequent process, as shown in FIG. 6A, metal lines 72 are formed over ILD1 56. Metal lines 72 in the same layer are collectively referred to as bottom metal layer M1. M0 vias 70 connect contact plugs 58, 60, and 62 to metal lines 72. Etch stop layer 66 is also formed over ILD1 56. In some embodiments, M0 vias 70 and metal lines 72 are formed in dielectric layer 68, wherein dielectric layer 68 may be formed of a low-k dielectric material having a k value smaller than about 3.0, or smaller than about 2.5, for example. M0 vias 70 and metal lines 72 may include a diffusion barrier layer and a copper-containing material over the diffusion barrier layer. In some embodiments, M0 vias 70 and metal lines 72 are formed using a dual-damascene process, and hence no noticeable interfaces are formed between M0 vias 70 and the respective overlying metal lines 72. In alternative embodiments, M0 vias 70 are formed using a single-damascene process, and metal lines 72 are also formed using another single-damascene process. In yet other embodiments, M0 vias 70 are not formed, while metal lines 72 are in contact with contact plugs 58, 60, and 62. In subsequent process, more metal layers (not shown) may be formed over metal layer M1.

Figure 6B:
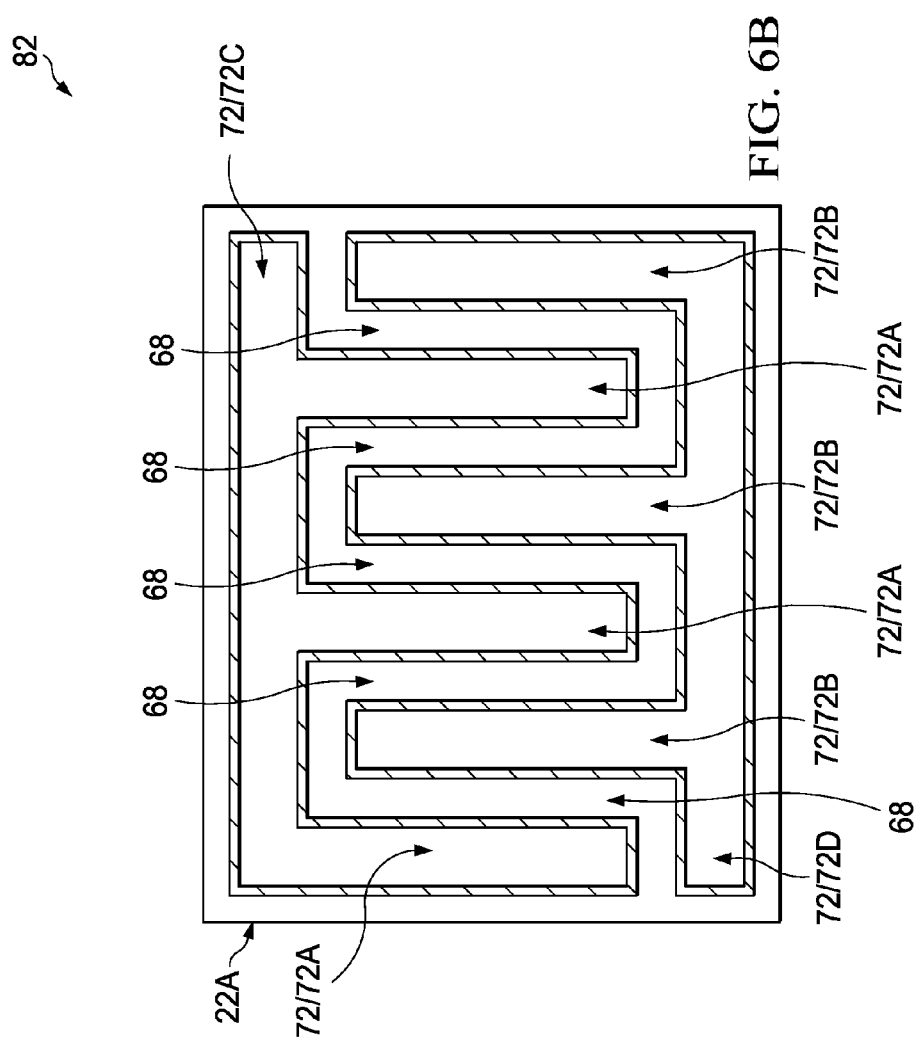

FIG. 6B illustrates a top view of a portion of the structure in FIG. 6A, wherein the top view is obtained from the plane crossing line 6B-6B in FIG. 6A. The top view illustrates metal lines 72 may overlap STI region 22A. In some embodiments, metal lines 72 include metal lines 72A that are electrically interconnected through metal line 72C, and metal lines 72B that are electrically interconnected through metal line 72D. Metal lines 72A, 72B, 72C, and 72D in combination form capacitor 82, wherein the interconnected metal lines 72A and 72C form a first capacitor plate (electrode) of capacitor 82, and the interconnected metal lines 72B and 72D/60D form a second capacitor plate (electrode) of capacitor 82. The portions of dielectric layer 68 between the first and the second capacitor plates are capacitor insulators.

Referring back to FIG. 6A, capacitors 63 (FIG. 5B) and 82 (6B) may be interconnected to form an integrated capacitor, wherein M0 vias 70A (FIG. 76A) electrically connect the first capacitor plate (52A and 52C, FIG. 5B) of capacitor 63 to the first capacitor plate (72A and 72C, FIG. 6B) of capacitor 82, and M0 vias 70B electrically connect the second capacitor plate (52B and 52D, FIG. 5B) of capacitor 63 to the second capacitor plate (72B and 72D, FIG. 6B) of capacitor 82.

In the above-discussed embodiments, slot contact plugs 52/62 (FIG. 6A) for forming capacitor 63 include lower portions 52 and upper portions 62 that are formed in separate processes. In alternative embodiments, instead of separating slot contact plugs into lower portions and upper portions, the slot contact plugs for forming capacitor 63 may also be formed in a single formation step, and formed simultaneously as the formation of the gate contact plug and the source/drain contact plugs of transistors.

In the embodiments of the present disclosure, slot contact plugs are used to form a capacitor. As a result, the capacitor extends into the ILD. Compared to conventional capacitors formed in the metal layers that are over the ILD, the capacitors in accordance with the embodiments may have greater capacitance values without the need to occupy larger chip areas. In addition, since the capacitance of a capacitor is proportional to the overlapping areas of the capacitor plate, and also since ILD0 34 and ILD1 56 (FIG. 6A) have high thickness values, the resulting capacitance of capacitor 63 is also high.

In accordance with some embodiments, an integrated circuit includes a semiconductor substrate, and an insulation region extending from a top surface of the semiconductor substrate into the semiconductor substrate. An ILD is overlying the insulation region. A capacitor includes a first capacitor plate including a first slot contact plug, and a second capacitor plate including a second slot contact plug. The first and the second contact plugs include portions in the ILD. A portion of the ILD between vertical surfaces of the first slot contact plug and the second slot contact plug acts as a capacitor insulator of the capacitor.

In accordance with other embodiments, an integrated circuit includes a transistor including a gate electrode over a semiconductor substrate, a source/drain region on a side of the gate electrode, and a source/drain contact plug overlapping and electrically coupled to the source/drain region. A first ILD overlies the semiconductor substrate, wherein the gate electrode is in the first ILD. An etch stop layer is over the first ILD. A second ILD is over the etch stop layer. A capacitor includes a first capacitor plate comprising a first slot contact plug, and a second capacitor plate comprising a second slot contact plug. Each of the first slot contact plug and the second slot contact plug includes an upper portion in the second ILD and the etch stop layer, and a lower portion in the first ILD.

In accordance with yet other embodiments, a method includes forming a transistor including forming a gate electrode over a semiconductor substrate, and forming a source/drain region on a side of the gate electrode. The method further includes forming an insulation region extending from a top surface of the semiconductor substrate into the semiconductor substrate, and forming an ILD over the semiconductor substrate. The first ILD is etched to form a first opening overlapping the source/drain region, and a first slot opening and a second slot opening overlapping the insulation region, wherein the etching stops on the insulation region and the source/drain region. The first opening, the first slot opening, and the second slot opening are filled to form a source/drain contact plug, a first slot contact plug, and a second slot contact plug, respectively. The first slot contact plug and the second slot contact plug are parallel to each other, and form two capacitor plates of a capacitor.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit comprising:
   a semiconductor substrate;
   an insulation region extending from a top surface of the semiconductor substrate into the semiconductor substrate;
   an Inter-Layer Dielectric (ILD) overlying the insulation region; and
   a capacitor comprising:
      a first capacitor plate comprising a first slot contact plug; and
      a second capacitor plate comprising a second slot contact plug, wherein the first and the second contact plugs comprise portions in the ILD, and wherein a portion of the ILD between vertical surfaces of the first slot contact plug and the second slot contact plug acts as a capacitor insulator of the capacitor.

2. The integrated circuit of claim 1 further comprising a transistor comprising:
   a source/drain region; and
   a source/drain contact plug over and electrically coupled to the source/drain region, wherein the source/drain contact plug is in the ILD.

3. The integrated circuit of claim 1 further comprising:
   an etch stop layer over the ILD; and
   an additional ILD over the etch stop layer, wherein the first slot contact plug comprises a an upper portion in the additional ILD and the etch stop layer, and a lower portion in the ILD, and wherein the upper portion and the lower portion form an interface.

4. The integrated circuit of claim 1 further comprising:
   a first via overlying and contacting the first slot contact plug;
   a first metal line overlying and the contacting the first via;
   a second via overlying and contacting the second slot contact plug; and
   a second metal line overlying and the contacting the second via.

5. The integrated circuit of claim 4, wherein the first metal line and the second metal line form a third capacitor plate and a fourth capacitor plate, respectively, of the capacitor.

6. The integrated circuit of claim 1, wherein the first and the second slot contact plugs have bottoms in contact with the insulation region.

7. The integrated circuit of claim 1 further comprising an etch stop layer between and contacting the ILD and the insulation region, wherein the first and the second slot contact plugs penetrate through the etch stop layer.

8. An integrated circuit comprising:
   a semiconductor substrate;
   a transistor comprising:
      a gate electrode over the semiconductor substrate;
      a source/drain region on a side of the gate electrode; and
      a source/drain contact plug overlapping and electrically coupled to the source/drain region;
   a first Inter-Layer Dielectric (ILD) over the semiconductor substrate, wherein the gate electrode is in the first ILD;
   an etch stop layer over the first ILD;
   a second ILD over the etch stop layer; and
   a capacitor comprising:

a first capacitor plate comprising a first slot contact plug; and a second capacitor plate comprising a second slot contact plug, wherein each of the first slot contact plug and the second slot contact plug comprises an upper portion in the second ILD and the etch stop layer, and a lower portion in the first ILD.

9. The integrated circuit of claim 8 further comprising a Shallow Trench Isolation (STI) region extending from a top surface of the semiconductor substrate into the semiconductor substrate, wherein the capacitor overlaps the STI region.

10. The integrated circuit of claim 9, wherein bottom surfaces of the first and the second slot contact plugs are in contact with a top surface of the STI region.

11. The integrated circuit of claim 8, wherein each of the first and the second slot contact plugs has a length and a width smaller than the length.

12. The integrated circuit of claim 8, wherein the capacitor comprises a plurality of parallel slot contact plugs allocated in an alternating layout.

13. The integrated circuit of claim 8 further comprising:
a first via overlying and contacting the first slot contact plug;
a first metal line overlying and the contacting the first via;
a second via overlying and contacting the second slot contact plug; and
a second metal line overlying and the contacting the second via.

14. The integrated circuit of claim 8, wherein top surfaces of the first and the second slot contact plugs are level with a top surface of the second ILD.

15. An integrated circuit comprising:
a semiconductor substrate;
an insulation region extending from a top surface of the semiconductor substrate into the semiconductor substrate;
an Inter-Layer Dielectric (ILD) overlying the insulation region;
a capacitor comprising:

a first capacitor plate comprising a first slot contact plug; and a second capacitor plate comprising a second slot contact plug, wherein the first and the second contact plugs comprise portions in the ILD, and wherein a portion of the ILD between vertical surfaces of the first slot contact plug and the second slot contact plug acts as a capacitor insulator of the capacitor; and a transistor comprising:
a source/drain region; and
a source/drain contact plug over and electrically coupled to the source/drain region, wherein the source/drain contact plug is in the ILD.

16. The integrated circuit of claim 15 further comprising:
an etch stop layer over the ILD; and
an additional ILD over the etch stop layer, wherein the first slot contact plug comprises a an upper portion in the additional ILD and the etch stop layer, and a lower portion in the ILD, and wherein the upper portion and the lower portion form an interface.

17. The integrated circuit of claim 15 further comprising:
a first via overlying and contacting the first slot contact plug;
a first metal line overlying and the contacting the first via;
a second via overlying and contacting the second slot contact plug; and
a second metal line overlying and the contacting the second via.

18. The integrated circuit of claim 17, wherein the first metal line and the second metal line form a third capacitor plate and a fourth capacitor plate, respectively, of the capacitor.

19. The integrated circuit of claim 15, wherein the first and the second slot contact plugs have bottoms in contact with the insulation region.

20. The integrated circuit of claim 15 further comprising an etch stop layer between and contacting the ILD and the insulation region, wherein the first and the second slot contact plugs penetrate through the etch stop layer.

* * * * *